US012562235B2

(12) United States Patent
Teng et al.

(10) Patent No.: US 12,562,235 B2
(45) Date of Patent: Feb. 24, 2026

(54) TESTING METHOD AND TESTING SYSTEM

(71) Applicant: Powerchip Semiconductor Manufacturing Corporation, Hsinchu (TW)

(72) Inventors: Tsai-Ko Teng, Hsinchu (TW); Yu Chih Yeh, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 105 days.

(21) Appl. No.: 18/791,443

(22) Filed: Aug. 1, 2024

(65) Prior Publication Data

US 2026/0011395 A1 Jan. 8, 2026

(30) Foreign Application Priority Data

Jul. 8, 2024 (TW) .................................. 113125441

(51) Int. Cl.
| | |
|---|---|
| *G11C 29/00* | (2006.01) |
| *G11C 29/14* | (2006.01) |
| *G11C 29/44* | (2006.01) |
| *G11C 29/48* | (2006.01) |
| *G11C 29/12* | (2006.01) |

(52) U.S. Cl.
CPC .............. *G11C 29/72* (2013.01); *G11C 29/14* (2013.01); *G11C 29/44* (2013.01); *G11C 29/48* (2013.01); *G11C 2029/1208* (2013.01)

(58) Field of Classification Search
CPC ......... G11C 29/44; G11C 29/14; G11C 29/48; G11C 2029/1208; G11C 29/72
See application file for complete search history.

(56) References Cited

U.S. PATENT DOCUMENTS

| | | | | |
|---|---|---|---|---|
| 5,795,797 A * | 8/1998 | Chester | .................. | G11C 29/72 438/4 |
| 6,073,258 A * | 6/2000 | Wheater | ................ | G11C 29/44 714/718 |
| 6,373,758 B1 * | 4/2002 | Hughes | .................. | G11C 29/72 365/201 |

(Continued)

FOREIGN PATENT DOCUMENTS

| | | |
|---|---|---|
| CN | 112599158 | 4/2021 |
| CN | 115631783 | 1/2023 |
| TW | I585772 | 6/2017 |

*Primary Examiner* — Steve N Nguyen
(74) *Attorney, Agent, or Firm* — JCIPRNET

(57) ABSTRACT

Disclosed are a testing method and a testing system. The testing method is configured to scan a three-dimensional memory chip. The three-dimensional memory chip includes a plurality of memory chips stacked with each other. The testing method includes: dividing each memory chip into a plurality of memory blocks; testing each memory block to detect a total failed first signal line quantity from a plurality of first signal lines extending along a first direction in each memory block, and to detect a total failed memory cell quantity of each memory block; and determining a failed bit quantity threshold according to the total failed first signal line quantity, and comparing the total failed memory cell quantity with the failed bit quantity threshold, to accordingly determine whether to set a marked first signal line quantity.

19 Claims, 8 Drawing Sheets

(56)            References Cited

U.S. PATENT DOCUMENTS

| | | | | |
|---|---|---|---|---|
| 6,425,095 | B1 * | 7/2002 | Yasui ............... | G01R 31/31926 |
| | | | | 365/201 |
| 6,795,942 | B1 * | 9/2004 | Schwarz ............ | G11C 29/4401 |
| | | | | 714/741 |
| 9,607,716 | B2 | 3/2017 | Kilmer et al. | |
| 2003/0005353 | A1 * | 1/2003 | Mullins .................. | G11C 29/44 |
| | | | | 714/723 |
| 2004/0163015 | A1 * | 8/2004 | Nadeau-Dostie ...... | G11C 29/44 |
| | | | | 714/42 |
| 2009/0172483 | A1 * | 7/2009 | Anzou ................... | G11C 29/44 |
| | | | | 714/E11.169 |
| 2010/0290288 | A1 | 11/2010 | Kang | |
| 2021/0375385 | A1 * | 12/2021 | Chiang ................. | G11C 29/76 |
| 2022/0208296 | A1 * | 6/2022 | Seok ...................... | G11C 29/76 |
| 2023/0178169 | A1 | 6/2023 | Son | |
| 2024/0222199 | A1 * | 7/2024 | Kim ........................ | H01L 22/12 |

* cited by examiner

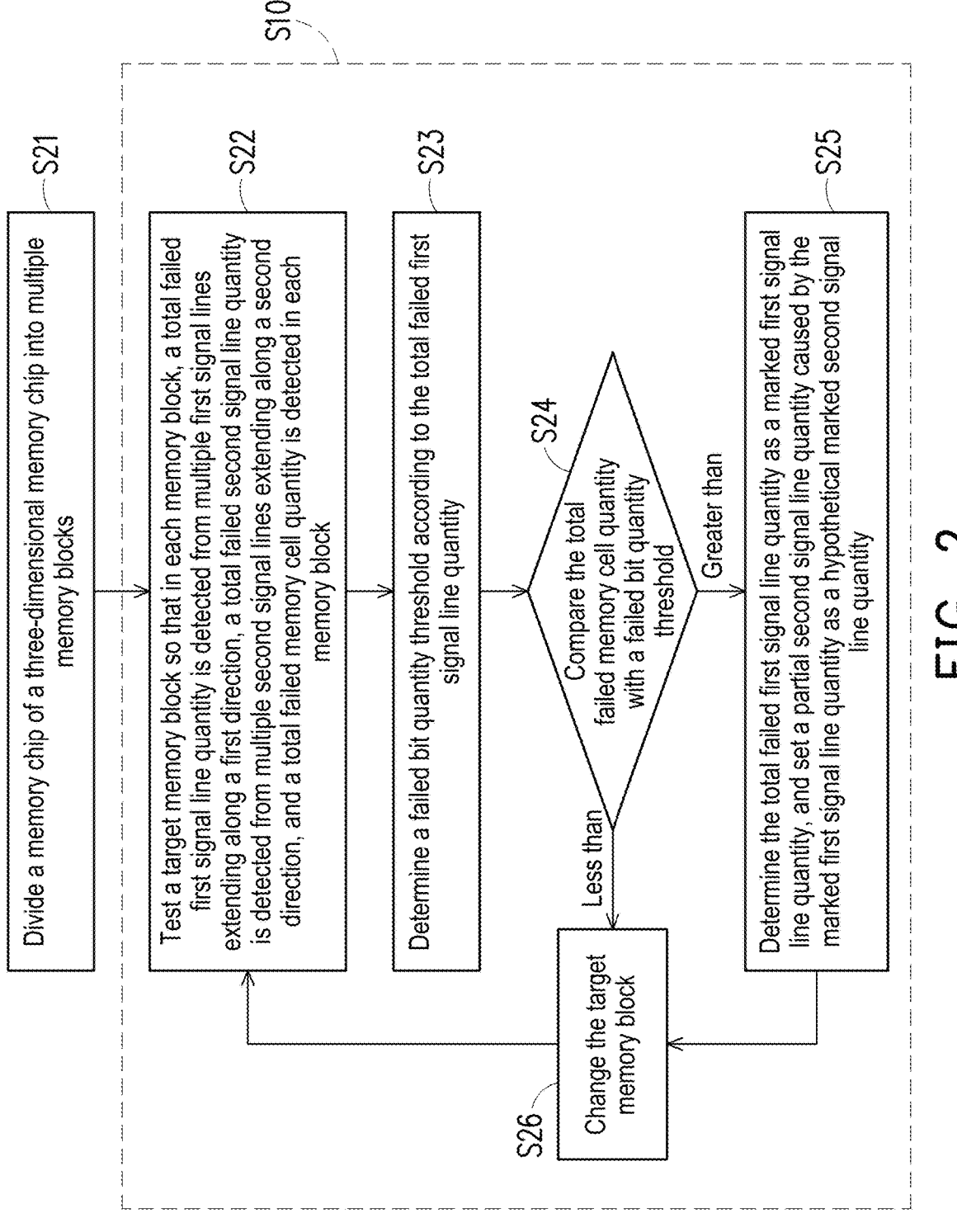

S10

S21 — Divide a memory chip of a three-dimensional memory chip into multiple memory blocks S22 — Test a target memory block so that in each memory block, a total failed first signal line quantity is detected from multiple first signal lines extending along a first direction, a total failed second signal line quantity is detected from multiple second signal lines extending along a second direction, and a total failed memory cell quantity is detected in each memory block S23 — Determine a failed bit quantity threshold according to the total failed first signal line quantity S24 — Compare the total failed memory cell quantity with a failed bit quantity threshold Less than Greater than S26 — Change the target memory block S25 — Determine the total failed first signal line quantity as a marked first signal line quantity, and set a partial second signal line quantity caused by the marked first signal line quantity as a hypothetical marked second signal line quantity

Determine whether the total failed first signal line quantity in the target memory block is equal to the total failed second signal line quantity

NO

YES

Change the target memory block

S33

Set the total failed first signal line quantity set as an independent failed memory cell quantity

S32

8b

82

8a

80

Three-dimensional memory chip

81

Testing device

TESTING METHOD AND TESTING SYSTEM

CROSS-REFERENCE TO RELATED APPLICATION

This application claims the priority benefit of Taiwan application serial no. 113125441, filed on Jul. 8, 2024. The entirety of the above-mentioned patent application is hereby incorporated by reference herein and made a part of this specification.

BACKGROUND

Technical Field

The disclosure relates to a method and a system, and in particular to a testing method and a testing system.

Description of Related Art

In three-dimensional memory chips, as the form of packaging and stacking becomes more and more complex, many additional failed memory cells are often caused in the memory chip. However, the large quantity of additional failed memory cells makes it difficult to analyze the failure causes.

SUMMARY

The disclosure provides a testing method and testing system that can efficiently determine stacking defects of three-dimensional memory chips.

The testing method of the disclosure is used to scan a three-dimensional memory chip. The three-dimensional memory chip includes multiple memory chips stacked with each other. The testing method includes: dividing each memory chip into multiple memory blocks; testing each memory block to detect a total failed first signal line quantity from multiple first signal lines extending along a first direction in each memory block, and to detect a total failed memory cell quantity in each memory block; and determining a failed bit quantity threshold according to the total failed first signal line quantity, and comparing the total failed memory cell quantity with the failed bit quantity threshold, to accordingly determine whether to set a marked first signal line quantity.

A testing system of the disclosure includes a three-dimensional chip memory and a testing device. The three-dimensional memory chip includes multiple layers of memory chips stacked with each other. The testing device is coupled to the three-dimensional memory chip and used to perform: dividing each memory chip into multiple memory blocks; testing each memory block to detect a total failed first signal line quantity from multiple first signal lines extending along a first direction in each memory block, and to detect a total failed memory cell quantity in each memory block; and determining a failed bit quantity threshold according to the total failed first signal line quantity, and comparing the total failed memory cell quantity with the failed bit quantity threshold, to accordingly determine whether to set a marked first signal line quantity.

Based on the above, the testing method and the testing system of the disclosure can determine the distribution patterns of failed memory cells in the memory chip, thereby the complex representation manners of failed memory cells are simplified.

BRIEF DESCRIPTION OF THE DRAWINGS

FIG. 2 is a flow chart of a testing method implemented in the disclosure.

DESCRIPTION OF THE EMBODIMENTS

Figure 1:
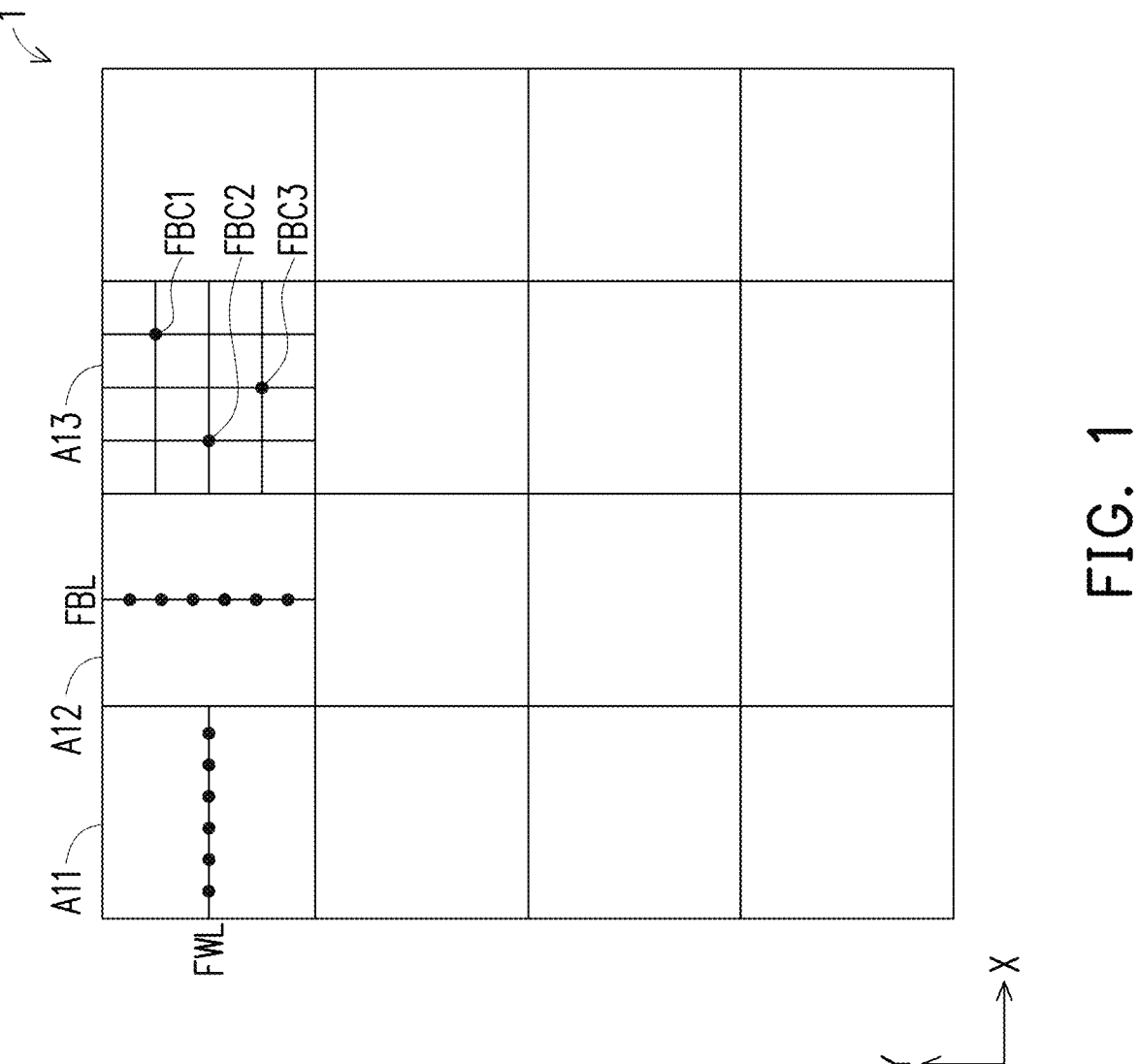
FIG. 1 is a schematic diagram of a memory chip according to an embodiment of the disclosure.

FIG. 1 is a schematic diagram of a memory chip 1 according to an embodiment of the disclosure. The memory chip 1 is divided into multiple memory blocks. FIG. 1 shows failed memory cells of the memory chip 1 with various distribution patterns. In order to facilitate the analysis and summary of failure causes, the failed memory cells shown in FIG. 1 are divided into three categories, so as to summarize and simplify a quantity of the failed memory cells appearing in a large quantity in the three-dimensional chip through the simplified distribution patterns of the three categories of failed memory cells (or also referred to as failed bits).

In detail, although not explicitly shown, the memory chip 1 includes multiple memory banks, and each memory bank is further divided into the multiple memory blocks. However, in order to facilitate the explanation of the distribution patterns of the failed memory cells in each memory block, only the memory blocks divided in the memory chip 1 are shown in FIG. 1, and labeling of the memory bank is omitted.

In the memory chip 1, each dot represents a failed memory cell. On a memory block A11 in the memory chip 1, there are multiple failed memory cells arranged and connected to the same word line extending along an X-axis direction, so this word line may be determined as a failed word line FWL. In some cases, the cause of this distribution pattern of failed memory cells may be caused by defects occurring on the word line. Instead of recording the location of each failed memory cell, under the distribution of the failed memory cells in the memory block A11, an operation may also be changed to record the failed word line FWL to represent all failed memory cells in the memory block A11.

In addition, on a memory block A12 in the memory chip 1, there are multiple failed memory cells arranged and connected to the same bit line extending along a Y-axis direction, so this bit line may be determined as failed bit line FBL. Similar to the description of the failed word line in the previous paragraph, under the distribution of the failed memory cells in the memory block A12, an operation may also be changed to record the failed bit line FBL to represent all failed memory cells in the memory block A12.

Finally, on a memory block A13 in the memory chip, there are multiple independent failed memory cells FBC1 to FBC3. Different from the arrangement patterns of the failed memory cells in the memory blocks A11, A12, the independent failed memory cells are arranged in different word lines and different bit lines. The occurrence of each failed memory cell is like an independent event. As for the arrangement manner of this type of failed memory cells, it is necessary to record addresses of all failed memory cells.

Therefore, based on the above, the distribution patterns of the failed memory cells may be divided into three categories of patterns: arranged along the word line, arranged along the bit line, and independently distributed. According to the respective distribution patterns, corresponding manners may be used to represent the failed word line, the failed bit line, or the independent failed memory cell.

FIG. 2 is a flow chart of a testing method implemented in the disclosure. The testing method in FIG. 2 may be applied to detect failed memory cells in the memory chip and represent the failed memory cells in the memory chip in the manner related to the content described in FIG. 1. Roughly speaking, the testing method in FIG. 2 may be used to detect whether the failed memory cells in the memory block are concentrated on specific first bit lines.

Specifically, the testing method in FIG. 2 includes Steps S21 to S26. In Step S21, the memory chip is first be divided into multiple memory blocks. Specifically, each memory chip contains multiple memory banks, and each memory bank contains memory blocks of the same size and quantity, so that in subsequent steps, the failed memory cells in each memory block may be analyzed.

In Step S22, the selected memory block is tested to detect the memory block, a total failed first signal line quantity is detected from multiple first signal lines extending along a first direction in the selected memory block, a total failed second signal line quantity is detected from multiple second signal lines extending along a second direction, and a total failed memory cell quantity is detected in each memory block. In other words, in this step, the total failed memory cell quantity, the total failed first signal line quantity, and the total failed second signal line quantity are detected.

Generally speaking, each memory block is disposed with multiple first signal lines extending along the first direction, and multiple second signal lines extending along the second direction different from the first direction. One memory cell may be disposed at the intersection of each first signal line and second signal line. For example, the first signal line may be a word line configured to control the activation or deactivation of each corresponding memory cell, and the second signal line may be a bit line configured to perform data transmission with each corresponding memory cell.

In Step S23, a failed bit quantity threshold may be determined according o the total failed first signal line quantity. Also, in Step S24, the total failed memory cell quantity may be compared with the failed bit quantity threshold to determine whether the target memory block belongs to the first distribution pattern of failed memory cells.

Specifically, Steps S23 and S24 are used to determine whether the failed memory cells in the target memory block are concentrated on part of the first signal lines, which is the concentration tendency of the failed memory cells in the memory block. In order to perform the determination, first, the corresponding failed bit quantity threshold may be determined according to the total failed first signal line quantity. In some embodiments, when the failed signal line quantity is less than or equal to the signal line threshold, the failed bit quantity threshold may be set to a first quantity, and when the failed signal line quantity is greater than the signal line threshold, the failed bit quantity threshold may be set to a second quantity greater than the first quantity. For example, when the total failed first signal line quantity is less than or equal to the signal line threshold of one, the failed bit quantity threshold may be set to the first quantity of four.

Also, when the failed signal line quantity is greater than one, the failed bit quantity threshold may be set to the second quantity of eight. In this way, the failed bit quantity threshold may be adjusted correspondingly according to the total failed first signal line quantity, and thus whether the failed memory cells in the target memory block are concentrated on specific failed first signal lines are determined appropriately.

In some embodiments, in response to possible different sizes of the memory block, the signal line threshold in the above step may be multiple thresholds, so as to determine which range the total failed first signal line quantity is in, and the corresponding failed bit quantity threshold may be set according to each range.

Following Step S24, when it is determined that the total failed memory cell quantity is greater than or equal to the failed bit quantity threshold, Step S25 may then be proceeded. When it is determined that the total failed memory cell quantity is less than the failed bit quantity threshold, Step S26 may then be proceeded.

In Step S25, the total failed first signal line quantity may be determined as a marked first signal line quantity, and a partial second signal line quantity caused by the failed memory cells of the marked first failed signal line may be set as a hypothetical marked second signal line quantity.

Specifically, since it has been determined through the comparison result of Step S24 that the failed memory cells of the target memory block are relatively concentrated on specific failed first signal lines, the total failed first signal line quantity may be used to represent the failed memory cells in the target memory block. On the other hand, since the failed memory cells in the target memory block have the distribution pattern concentrated on the specific first signal lines, calculation may be made on the failed memory cells distributed on the marked first failed signal lines, so as to calculate the partial second signal line quantity of the distributed failed memory cells on the marked first signal line quantity, and the partial second signal line quantity is set to the hypothetical marked second signal line quantity to facilitate subsequent determination.

When the comparison result of Step S24 is no, or after Step S25 ends, Step S26 is proceeded. In Step S26, the position of the target memory block is changed to detect and determine a next target memory block.

Overall, Steps S22 to S26 may be regarded as one Step S10. The memory blocks in the memory chip are detected one by one, and are respectively determined whether the respective failed memory cells in the memory chip are concentrated on specific first signal lines, to accordingly set the total failed first signal line quantity and the hypothetical marked second signal line quantity.

Figure 3:
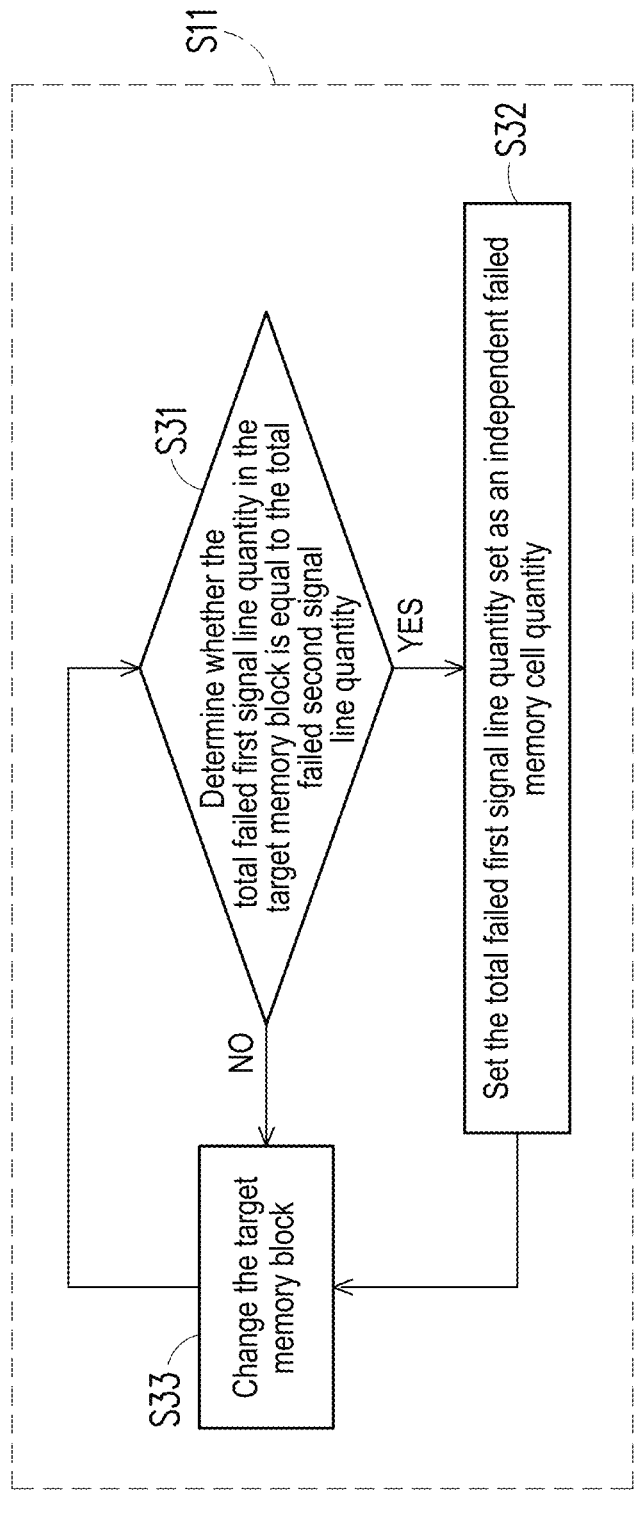
FIG. 3 is a flow chart of a testing method implemented in the disclosure.

FIG. 3 is a flow chart of a testing method implemented in the disclosure. The testing method in FIG. 3 may be applied to detect failed memory cells in the memory chip and represent the failed memory cells in the memory chip in the manner related to the content described in FIG. 1. In this embodiment, the testing method in FIG. 3 may, for example, be executed after the testing method in FIG. 2. In detail, after the marked first signal line quantity of each memory block is determined in the testing method in FIG. 2, that is, after whether the concentration tendency of the failed memory cells is arranged along the first signal line direction is determined, whether the failed memory cells are independently distributed in the memory block may be subsequently detected and determined.

The testing method in FIG. 3 includes Steps S31 to S33. In Step S31, it is first determined whether the total failed first signal line quantity in the target memory block is equal to the total failed second signal line quantity. By determining whether the total failed first signal line quantity is equal to the total failed second signal line quantity, it may be determined whether the failed memory cells have a tendency to be arranged along the first signal line or the second signal line. Under the independent distribution pattern of failed memory cells, a random distribution is presented. Therefore, when it is determined that the total failed first signal line quantity is equal to the total failed second signal line quantity, the failed memory cells in the target memory block may be determined as independently distributed. Therefore, in Step S31, when it is determined that the total failed first signal line quantity is equal to the total failed second signal line quantity, Step S32 may be proceeded to perform corresponding parameter settings. If not, then Step S33 may be proceeded.

In Step S32, in response to determining that the memory cells in the target memory block are independently distributed, the total failed first signal line quantity may be set as the independent failed memory cell quantity.

Moreover, when the comparison result of Step S31 is no, or after Step S32 is completed, Step S33 is proceeded to change the position of the target memory block to detect and determine a next target memory block.

In this embodiment, the criteria for whether the failed memory cells are independently distributed is whether the total failed first signal line quantity is equal to the total failed second signal line quantity. However, in other embodiments, the criteria for whether the failed memory cells are independently distributed may also be that the difference between the total failed first signal line quantity and the total failed second signal line quantity is within a preset quantity range. Alternatively, the total failed second signal line quantity may also be used to set as the independent failed memory cell quantity.

Overall, Steps S31 to S33 may be regarded as one Step S11, which detects the memory blocks in the memory chip one by one, and respectively determines whether the respective failed memory cells in the memory chip are of the independent distribution pattern, and setting of the independent failed memory cell quantity is performed accordingly.

Figure 4:
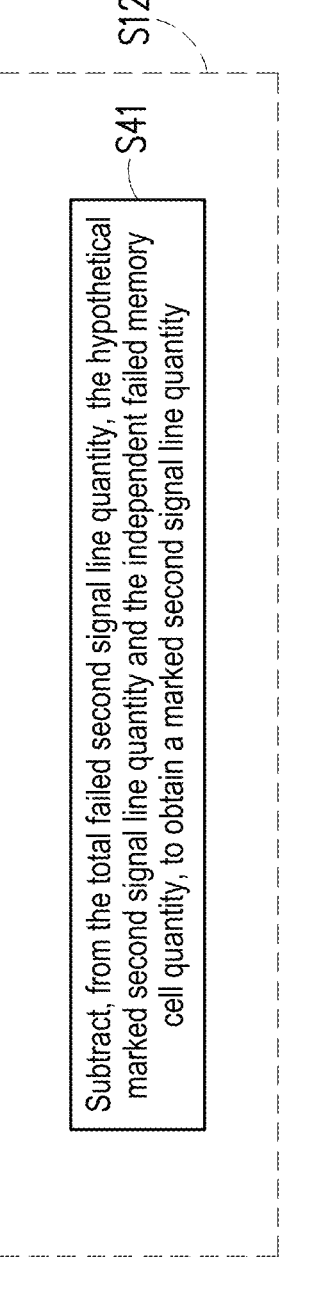
FIG. 4 is a flow chart of a testing method implemented in the disclosure.

FIG. 4 is a flow chart of a testing method implemented in the disclosure. The testing method in FIG. 4 may be applied to detect failed memory cells in the memory chip and represent the failed memory cells in the memory chip in the manner related to the content described in FIG. 1. In this embodiment, the testing method in FIG. 4 may, for example, be executed after the testing method in FIG. 2 and FIG. 3. In detail, after the testing method in FIG. 2 and FIG. 3 are executed, it may be determined whether the respective failed memory cells in each memory block are concentrated in specific first signal line directions or are independently distributed. Also, after the testing method in FIG. 2 and FIG. 3 are executed, the failed memory cells in the target memory block may be set to be distributed along specific second signal lines.

The testing method in FIG. 4 includes Step S41. In Step S41, the hypothetical marked second signal line quantity and the independent failed memory cell quantity are subtracted from the total failed second signal line quantity to obtain a marked second signal line quantity. In detail, after the testing method in FIG. 2 and FIG. 3 are executed, the analysis of the two distribution patterns have been completed for the failed memory cells in the target memory block. Therefore, in Step S41, the third distribution pattern may be directly determined according to the previous analysis results.

Specifically, the hypothetical marked second signal line quantity and the independent failed memory cell quantity may be subtracted from the total failed second signal line quantity. When the failed memory cells in the target memory block are determined to be distributed along specific first signal lines, the hypothetical marked second signal line may be set to store the failed second signal lines quantity caused by the memory cells. Therefore, by subtracting the hypothetical marked second signal line quantity and the independent failed memory cell quantity from the total failed second signal line quantity, the detected failed second signal line quantity caused by the memory cells of the first two distribution patterns (that is, distributed along the first signal line and independently distributed) may be excluded, and thus the failed second signal line quantity caused by the failed memory cells distributed along specific second signal lines is obtained (that is, the marked second signal line quantity).

Overall, Step S41 may be regarded as Step S12 executed subsequently after Steps S10, S11, after determination of the first two distribution patterns of the failed memory cells in the target memory block is completed, according to the previous determination results, whether the failed memory cells are distributed along the specific second signal lines is determined, and the marked second signal line quantity is accordingly calculated.

Figure 5:
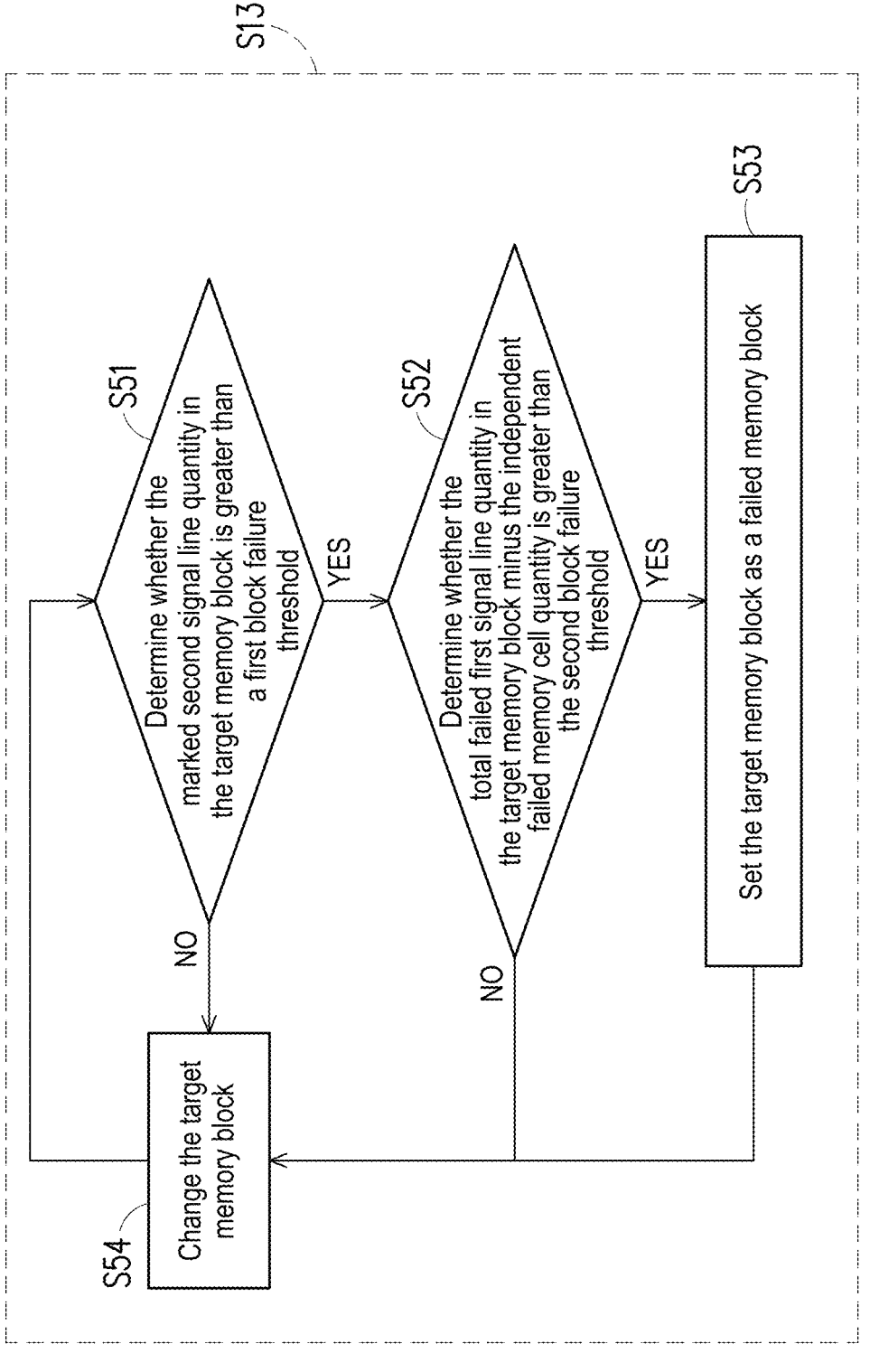
FIG. 5 is a flow chart of a testing method implemented in the disclosure.

FIG. 5 is a flow chart of a testing method according to an embodiment of the disclosure. The testing method shown in FIG. 5 may be continued from the testing method in FIG. 2 to FIG. 4 to determine whether the target memory block is failed or defective.

The testing method in FIG. 5 includes Steps S51 to S54. In Step S51, whether the marked second signal line quantity in the target memory block is greater than the first block failure threshold may be determined. In detail, the marked second signal line quantity is subsequently determined after the marked first signal line quantity and the independent signal line quantity. When the failed memory cells are not simply distributed along specific first signal lines or show sporadic independent distribution patterns, the remaining failed memory cells are categorized into failures of the second signal line. Therefore, in addition to the distribution pattern of failed memory cells along the second signal line, the marked second signal line quantity may also contain more complex failed memory cell distribution pattern that cannot be summarized by the three distributions in FIG. 1. Therefore, when it is determined that the marked second signal line quantity is too large, that is, being greater than the first block failure threshold, Step S52 is proceeded.

In Step S52, whether the total failed first signal line quantity in the target memory block minus the independent failed memory cell quantity is greater than the second block failure threshold is determined. Specifically, the independent failed memory cell quantity of is deducted from the total failed first signal line quantity, which corresponds to the failed memory cells detected in the early stage of detection. If the result after deduction is greater than the second block failure threshold, then the result means that the determination results of Step S51 and Step S52 are both yes, and Step S53 is proceeded.

In Step S53, in response to both the first block failure threshold and the second block failure threshold being reached, the target memory block may be set as a failed memory block.

After the execution of Step S53 is completed, or if the determination result of either Step S51 or S52 is no, then Step S54 is proceeded. The target memory block is changed, and whether a next target memory block is failed is determined until determination of all target memory blocks are completed.

Overall, Steps S51 to S54 may be regarded as Step S13 executed subsequently after Steps S10 to S12. According to the distribution pattern of failed memory cells determined in Steps S10 to S12, whether to set the target memory block as the failed memory block is set.

Figure 6:
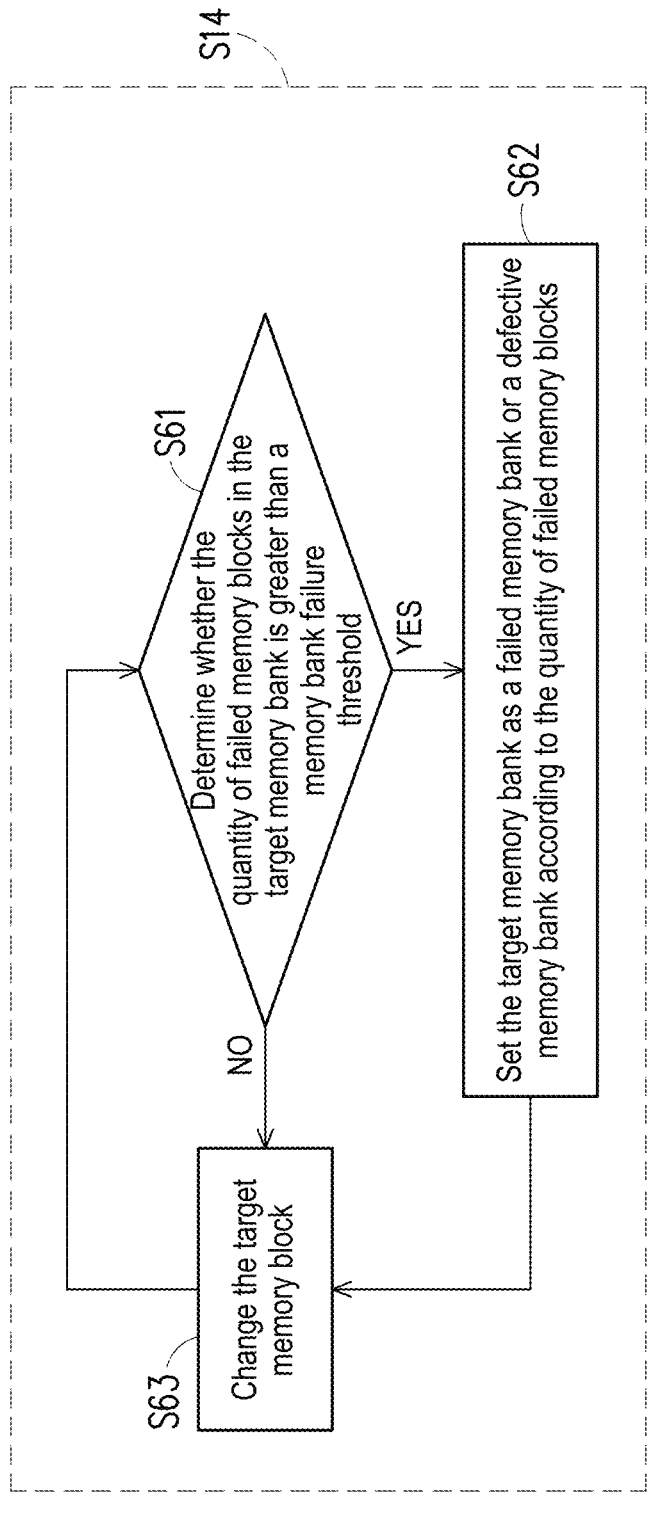
FIG. 6 is a flow chart of a testing method implemented in the disclosure.

FIG. 6 is a flow chart of a testing method according to an embodiment of the disclosure. The testing method shown in FIG. 6 may be continued from the testing method in FIG. 2 to FIG. 5 to determine whether each memory bank is a failed memory bank or a defective memory bank.

In Step S61, whether the quantity of failed memory blocks in the target memory bank is greater than a memory bank failure threshold may be determined. Also, when the determination result in Step S61 is yes, Step S62 is executed again. According to the quantity of failed memory blocks, the target memory bank is set as a failed memory bank or a defective memory bank.

For example, the memory bank failure threshold may be, for example, five. When it is determined that the quantity of failed memory blocks in the target memory bank is greater than or equal to the memory bank failure threshold of five, the target memory bank may be determined to be a failed memory bank. In contrast, when it is determined that there are failed memory blocks in the target memory bank, and the quantity of failed memory blocks is less than the memory bank failure threshold of five, the target memory bank may be set to a slightly defective memory bank.

Finally, after Step S62 is completed, or when the determination result of Step S61 is no, Step S63 is proceeded to change the target memory bank to perform determination on a next memory bank until determination of all memory banks is completed.

Overall, Steps S61 to S63 may be regarded as Step S14 executed subsequently after Steps S10 to S13, and the target memory bank is accordingly set as defective or failed.

Figure 7:
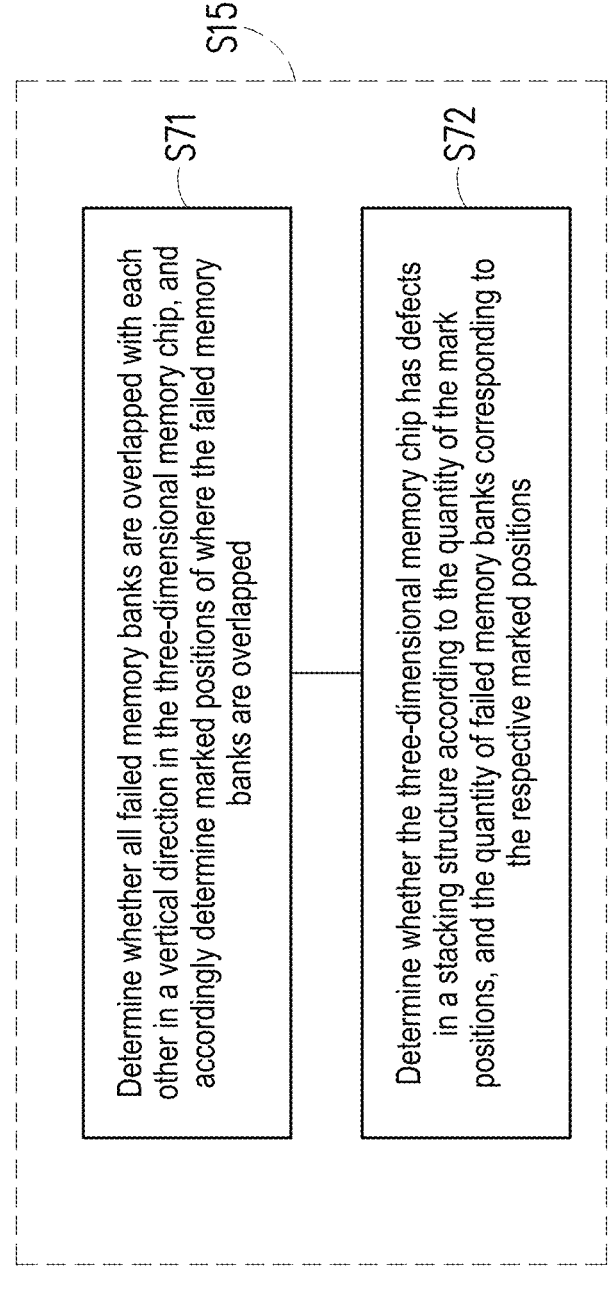
FIG. 7 is a flow chart of a testing method implemented in the disclosure.

FIG. 7 is a flow chart of a testing method according to an embodiment of the disclosure. The testing method shown in FIG. 7 may be continued from the testing method in FIG. 2 to FIG. 6 to determine whether the three-dimensional memory chip has defects in the stacking structure.

The testing method in FIG. 7 includes Steps S71 to S72. In Step S71, whether the failed memory banks are overlapped with each other in the vertical direction may be determined for all failed memory banks in the three-dimensional memory chip, and the marked positions of where the failed memory banks are overlapped are accordingly determined. Specifically, after determination of the failed memory banks for each layer of memory chips, the positions of the memory banks may be analyzed to determine whether the failed memory banks are overlapped with each other in vertical positions. When it is determined that there are overlapping failed memory banks in the three-dimensional memory chip, the overlapping position is marked, and the quantity of failed memory banks overlapped at the marked position is determined.

In Step S72, according to the quantity of the mark positions, and the quantity of failed memory banks corresponding to the respective marked positions, whether the three-dimensional memory chip has defects in the stacking structure may be determined. In detail, the quantity of failed memory banks occurring at the same marked position are first calculated to determine how many failed memory banks there are at the same marked position. According to the quantity of failed memory banks at the marked position, whether the three-dimensional memory chip has defects may be determined. In some embodiments, the quantity of failed memory banks at the marked position may be compared with multiple chip failure thresholds to determine which range interval the three-dimensional memory chip falls into, and the defective level of the three-dimensional memory chip is accordingly determined.

For example, for a three-dimensional memory chip with four layers of chips stacked, when the quantity of failed memory banks at the marked position reaches three or more, it means that the stacked structure causes three layers of the four-layer memory chip to fail or to be damaged. Therefore, the three-dimensional memory chip may be determined to be a relatively serious defect. In contrast, when the quantity of failed memory banks at the marked position is less than three, although the stacking structure has defects, the degree is relatively minor, and the three-dimensional memory chip may be determined to be slightly defective.

For another example, for a four-layer three-dimensional memory chip, it is determined that two layers of the chip have eight failed memory banks connected to each other at the same position. In this case, the three-dimensional memory chip may be determined to be a relatively serious defect. In contrast, when there is only one layer with eight failed memory banks connected to each other in the three-dimensional memory chip, in this case, the three-dimensional memory chip may be determined to be slightly defective.

Generally speaking, Steps S71 to S73 may be regarded as Step S15 executed subsequently after Steps S10 to S14, and whether the three-dimensional memory chip has defects and the degree of the defects are accordingly determined.

Figure 8B:
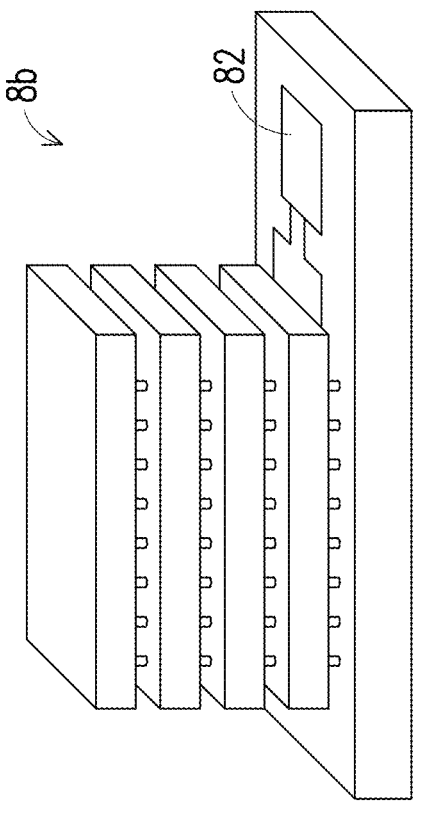
FIG. 8B is a schematic diagram of the testing system according to another embodiment of the disclosure.
Figure 8A:
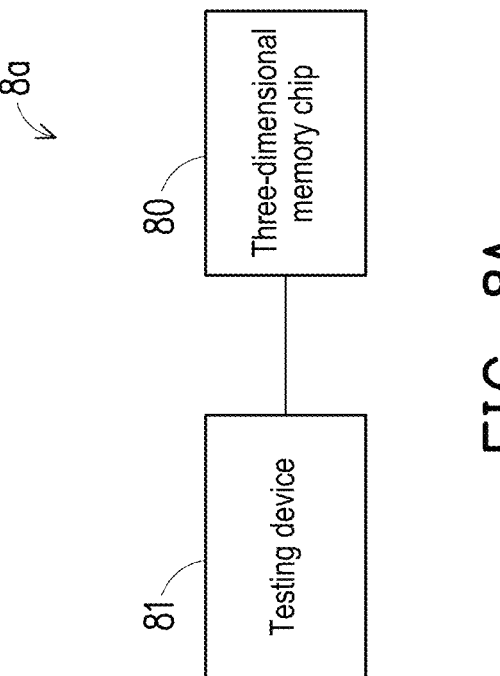
FIG. 8A is a block diagram of a testing system according to an embodiment of the disclosure.

FIG. 8A is a block diagram of a testing system 8a according to an embodiment of the disclosure. The testing system 8a includes a three-dimensional memory chip 80 and a testing device 81. The three-dimensional memory chip 80 includes multiple layers of memory chips stacked with each other. The testing device 81 is coupled to the three-dimensional chip memory 80 and may be used to perform the testing method described in FIG. 2 to FIG. 7 to determine whether the three-dimensional memory chip 80 has defects caused by stacking.

In some embodiments, the testing device 81 may be, for example, a laptop computer or related testing equipment. The testing device 81 may include a central processing unit and a memory to perform testing on the three-dimensional memory chip 80.

FIG. 8B is a schematic diagram of a testing system 8b according to another embodiment of the disclosure. The testing system 8b also includes the three-dimensional memory chip 80, and a built-in self test (BIST) circuit 82 disposed in the three-dimensional memory chip 80. Specifically, the three-dimensional memory chip 80 includes multiple layers of stacked memory chips coupled to each other through vias or connection structures and configured to perform signal transmission. Each memory chip is disposed with an array formed by memory cells. A logic chip is disposed below the multiple layers of stacked memory chips to be coupled with the memory chips. A logic circuit is disposed on the logic chip, which may access the data stored in the memory chip and perform corresponding operations. The built-in self test circuit 82 is disposed on the logic chip and connected to the memory chip through metal traces and vias. The built-in self test circuit 82 may access the memory chip and is used to execute the testing method described in FIG. 2 to FIG. 7 to determine whether the three-dimensional memory chip 80 has defects caused by stacking.

In some embodiments, although not explicitly shown, the testing device 81 may also be formed by multiple BIST circuits. Specifically, the multiple BIST circuits of the testing device 81 may be respectively disposed in the memory chip. Each BIST circuit may test the memory chip of the layer and determine including the marked first signal line quantity, the marked second signal line quantity, the independent failed memory cell quantity, the failed memory block quantity, and/or the determination result of the failed memory bank. Moreover, each BIST circuit may share the determination results with BIST circuits of other layers to determine whether the three-dimensional memory chip has defects in the stacking structure. Regarding the above operations of each BIST circuit performs testing and determining of the layer including the marked first signal line quantity, the marked second signal line quantity, the independent failed memory cell quantity, the failed memory block quantity, and/or the determination result of the failed memory bank, reference may be made to the related paragraphs above, so details will not be repeated here.

In summary, the testing method and the testing system of the disclosure can determine the distribution patterns of failed memory cells in the memory chip, thereby the complex representation manners of failed memory cells are simplified. Based on above, the correlation of failed memory banks between different memory chips is determined, thereby whether the three-dimensional memory chip has defects caused by stacking is determined.

What is claimed is:

1. A testing method configured to scan a three-dimensional memory chip, wherein the three-dimensional memory chip comprises a plurality of memory chips stacked with each other, and the testing method comprises:
   dividing each of the memory chips into a plurality of memory blocks;
   testing each of the memory blocks to detect a total failed first signal line quantity from a plurality of first signal lines extending along a first direction in each of the memory blocks, and to detect a total failed memory cell quantity in each of the memory blocks; and
   determining a failed bit quantity threshold according to the total failed first signal line quantity, and comparing the total failed memory cell quantity with the failed bit quantity threshold, to accordingly determine whether to set a marked first signal line quantity.

2. The testing method as claimed in claim 1, wherein in response to the total failed first signal line quantity being less than or equal to a signal line threshold, the failed bit quantity threshold is set to a first quantity, and in response to the total failed first signal line quantity being greater than the signal line threshold, the failed bit quantity threshold is set to a second quantity greater than the first quantity.

3. The testing method as claimed in claim 2, wherein in response to the total failed memory cell quantity being greater than or equal to the failed bit quantity threshold, the total failed first signal line quantity are determined to be the marked first signal line quantity.

4. The testing method as claimed in claim 1, comprising:
   detecting a total failed second signal line quantity from a plurality of second signal lines extending along a second direction in each of the memory blocks, wherein the first direction is different from the second direction.

5. The testing method as claimed in claim 4, comprising:
   in response to the marked first signal line quantity being set, determining a partial second signal line quantity generated by the marked first signal line quantity, and the partial second signal line quantity is set to a hypothetical marked second signal line quantity.

6. The testing method as claimed in claim 5, comprising:
   subtracting the hypothetical marked second signal line quantity from the total failed second signal line quantity to obtain a marked second signal line quantity.

7. The testing method as claimed in claim 6, further comprising:
   before calculating the marked second signal line quantity, determining whether to set an independent failed memory cell quantity by comparing the total failed first signal line quantity with the total failed second signal line quantity.

8. The testing method as claimed in claim 7, wherein in response to the total failed first signal line quantity being equal to the total failed second signal line quantity, the total failed first signal line quantity is set as the independent failed memory cell quantity.

9. The testing method as claimed in claim 8, further comprising:
   subtracting the hypothetical marked second signal line quantity and the independent failed memory cell quantity from the total failed second signal line quantity to obtain the marked second signal line quantity.

10. The testing method as claimed in claim 1, further comprising: in response to the total failed first signal line quantity in each of the memory blocks minus an independent failed memory cell quantity being greater than or equal to a first block failure threshold, and a marked second signal line quantity in each of the same memory blocks being greater than or equal to a second block failure threshold, setting each of the corresponding memory blocks as a failed memory block.

11. The testing method as claimed in claim 10, wherein each of the memory chips is further divided into a plurality of memory banks, each of the memory banks comprises the memory blocks, and the testing method further comprises:
   determining whether to set each of the memory banks as a failed memory bank according to a failed block quantity set of the failed memory block in each of the memory banks.

12. The testing method as claimed in claim 11, further comprising:
   selecting the failed memory banks overlapped with each other in a vertical position according to the failed memory banks in the three-dimensional memory chip; and
   determining whether the three-dimensional memory chip has a stacking structure defect according to a quantity of the failed memory banks overlapped with each other in the vertical position.

13. A testing system, comprising:
   a three-dimensional memory chip comprising a plurality of layers of memory chips stacked with each other; and
   a testing device coupled to the three-dimensional memory chip and configured to perform the following:
   dividing each of the memory chips into a plurality of memory blocks;
   testing each of the memory blocks to detect a total failed first signal line quantity from a plurality of first signal lines extending along a first direction in each of the memory blocks, and to detect a total failed memory cell quantity in each of the memory blocks; and determining a failed bit quantity threshold according to the total failed first signal line quantity, and comparing the total failed memory cell quantity with the failed bit quantity threshold, to accordingly determine whether to set a marked first signal line quantity.

14. The testing system as claimed in claim 13, wherein the testing system is an external testing device and/or a built-in self test (BIST) circuit built into a logic chip in the three-dimensional memory chip.

15. The testing system as claimed in claim 13, wherein the testing system comprises a plurality of built-in self test (BIST) circuits respectively disposed in the layers of memory chips, and each of the built-in self test circuits is configured to determine the marked first signal line quantity in each of the corresponding memory chips.

16. The testing system as claimed in claim 14, wherein one of the built-in self test circuits is configured to share the corresponding marked first signal line quantity to at least one of the other built-in self test circuits.

17. The testing system as claimed in claim 15, wherein each of the built-in self test circuits is further configured to:

in response to the total failed first signal line quantity in each of the memory blocks minus the independent failed memory cell quantity being greater than or equal to a first block failure threshold, and a marked second signal line quantity in each of the same memory blocks being greater than or equal to a second block failure threshold, set each of the corresponding memory blocks as a failed memory block.

18. The testing system as claimed in claim 17, wherein each of the memory chips is further divided into a plurality of memory banks, each of the memory banks comprises the memory blocks, and each of the built-in self test circuits is further configured to:

determine whether to set each of the memory banks as a failed memory bank according to a failed block quantity set of the failed memory block in each of the memory banks.

19. The testing system as claimed in claim 18, wherein the testing device is further configured to:

select the failed memory banks overlapped with each other in a vertical position according to the failed memory banks in the three-dimensional memory chip; and determine whether the three-dimensional memory chip has a stacking structure defect according to a quantity of the failed memory banks overlapped with each other in the vertical position.

* * * * *